US009300349B2

(12) United States Patent
Kyles et al.

(10) Patent No.: US 9,300,349 B2
(45) Date of Patent: Mar. 29, 2016

(54) EXTREMELY HIGH FREQUENCY (EHF) COMMUNICATION CONTROL CIRCUIT

(71) Applicant: Keyssa, Inc., Campbell, CA (US)

(72) Inventors: Ian A. Kyles, West Linn, OR (US); Gary D. McCormack, Tigard, OR (US)

(73) Assignee: Keyssa, Inc., Campbell, CA (US)

( * ) Notice: Subject to any disclaimer, the term of this patent is extended or adjusted under 35 U.S.C. 154(b) by 0 days.

(21) Appl. No.: 14/563,806

(22) Filed: Dec. 8, 2014

(65) Prior Publication Data

US 2015/0094002 A1  Apr. 2, 2015

Related U.S. Application Data

(63) Continuation of application No. 13/787,789, filed on Mar. 6, 2013, now Pat. No. 8,929,834.

(60) Provisional application No. 61/607,379, filed on Mar. 6, 2012.

(51) Int. Cl.
*H04B 17/00* (2015.01)
*H04B 1/40* (2015.01)
*H04B 17/13* (2015.01)
*H04B 17/21* (2015.01)
*H04B 17/10* (2015.01)
*H04B 1/04* (2006.01)

(52) U.S. Cl.
CPC ............... *H04B 1/40* (2013.01); *H04B 17/00* (2013.01); *H04B 17/13* (2015.01); *H04B 17/21* (2015.01); *H04B 17/102* (2015.01); *H04B 2001/0416* (2013.01)

(58) Field of Classification Search
CPC ........ H04W 52/24; H04L 1/0026; H04B 7/005
USPC .......... 455/69, 70, 125, 200.1, 67.11, 71, 136, 455/115.1, 226.1
See application file for complete search history.

(56) References Cited

U.S. PATENT DOCUMENTS 3,796,831 A  3/1974  Bauer
4,485,312 A  11/1984  Kusakabe et al.
(Continued)

FOREIGN PATENT DOCUMENTS

CN  1151058 A  6/1997
EP  0 515 187 A2  11/1992
(Continued)

OTHER PUBLICATIONS

Chinese First Office Action, Chinese Application No. 2013800238085, Jun. 30, 2015, 11 pages.
(Continued)

Primary Examiner — Minh D Dao
(74) Attorney, Agent, or Firm — Fenwick & West LLP

(57) ABSTRACT

An EHF communication system including an EHF communication chip. The EHF communication chip may include an EHF communication circuit having at least one controllable parameter-based module having a testable and controllable operating parameter The EHF communication chip may further include a test and trim circuit coupled to the EHF communication circuit, where the test and trim circuit includes a logic circuit having one or more memory elements, where the logic circuit is coupled to the controllable parameter-based module.

12 Claims, 7 Drawing Sheets

(56) References Cited

U.S. PATENT DOCUMENTS

| | | | |
|---|---|---|---|
| 4,497,068 A | 1/1985 | Fischer | |
| 4,694,504 A | 9/1987 | Porter et al. | |
| 4,868,795 A * | 9/1989 | McDavid et al. | 367/77 |
| 5,543,808 A | 8/1996 | Feigenbaum et al. | |
| 5,566,363 A * | 10/1996 | Senda | 455/126 |
| 5,621,913 A | 4/1997 | Tuttle et al. | |
| 5,754,948 A | 5/1998 | Metze | |
| 5,773,878 A | 6/1998 | Lim et al. | |
| 5,786,626 A | 7/1998 | Brady et al. | |
| 5,956,626 A | 9/1999 | Kaschke et al. | |
| 5,982,760 A * | 11/1999 | Chen | 370/335 |
| 6,038,428 A * | 3/2000 | Mizusawa et al. | 455/69 |
| 6,301,485 B1 * | 10/2001 | Lee | 455/522 |
| 6,351,237 B1 | 2/2002 | Martek et al. | |
| 6,490,443 B1 | 12/2002 | Freeny, Jr. | |
| 6,492,973 B1 | 12/2002 | Kuroki et al. | |
| 6,534,784 B2 | 3/2003 | Eliasson et al. | |
| 6,542,720 B1 | 4/2003 | Tandy | |
| 6,590,544 B1 | 7/2003 | Filipovic | |
| 6,607,136 B1 | 8/2003 | Atsmon et al. | |
| 6,718,163 B2 | 4/2004 | Tandy | |
| 6,718,275 B2 | 4/2004 | Nagase et al. | |
| 6,738,016 B2 * | 5/2004 | Li et al. | 342/360 |
| 6,915,529 B1 | 7/2005 | Suematsu et al. | |
| 6,967,347 B2 | 11/2005 | Estes et al. | |
| 7,015,826 B1 * | 3/2006 | Chan et al. | 340/870.17 |
| 7,019,585 B1 * | 3/2006 | Wilson et al. | 327/541 |
| 7,107,019 B2 | 9/2006 | Tandy | |
| 7,213,766 B2 | 5/2007 | Ryan et al. | |
| 7,311,526 B2 | 12/2007 | Rohrbach et al. | |
| 7,512,395 B2 | 3/2009 | Beukema et al. | |
| 7,517,222 B2 | 4/2009 | Rohrbach et al. | |
| 7,557,553 B2 * | 7/2009 | Su et al. | 323/282 |
| 7,593,708 B2 | 9/2009 | Tandy | |
| 7,598,923 B2 | 10/2009 | Hardacker et al. | |
| 7,599,427 B2 | 10/2009 | Bik | |
| 7,612,630 B2 | 11/2009 | Miller | |
| 7,617,342 B2 | 11/2009 | Rofougaran | |
| 7,645,143 B2 | 1/2010 | Rohrbach et al. | |
| 7,656,205 B2 | 2/2010 | Chen et al. | |
| 7,664,461 B2 | 2/2010 | Rofougaran et al. | |
| 7,760,045 B2 | 7/2010 | Kawasaki | |
| 7,761,092 B2 | 7/2010 | Desch et al. | |
| 7,768,457 B2 | 8/2010 | Pettus et al. | |
| 7,769,347 B2 | 8/2010 | Louberg et al. | |
| 7,778,621 B2 | 8/2010 | Tandy | |
| 7,791,167 B1 | 9/2010 | Rofougaran | |
| 7,820,990 B2 | 10/2010 | Schroeder et al. | |
| 7,889,022 B2 | 2/2011 | Miller | |
| 7,907,924 B2 | 3/2011 | Kawasaki | |
| 7,929,474 B2 | 4/2011 | Pettus et al. | |
| 8,014,416 B2 | 9/2011 | Ho et al. | |
| 8,036,629 B2 | 10/2011 | Tandy | |
| 8,041,227 B2 | 10/2011 | Holcombe et al. | |
| 8,063,769 B2 | 11/2011 | Rofougaran | |
| 8,081,699 B2 | 12/2011 | Siwiak et al. | |
| 8,087,939 B2 | 1/2012 | Rohrbach et al. | |
| 8,121,542 B2 | 2/2012 | Zack et al. | |
| 8,183,935 B2 | 5/2012 | Milano et al. | |
| 8,244,179 B2 | 8/2012 | Dua | |
| 8,279,611 B2 | 10/2012 | Wong et al. | |
| 8,339,258 B2 | 12/2012 | Rofougaran | |
| 2002/0058484 A1 | 5/2002 | Bobier et al. | |
| 2002/0130650 A1 * | 9/2002 | Nagase et al. | 323/371 |
| 2003/0034018 A1 * | 2/2003 | Baldwin et al. | 123/676 |
| 2004/0214621 A1 | 10/2004 | Ponce De Leon et al. | |
| 2005/0140436 A1 | 6/2005 | Ichitsubo et al. | |
| 2006/0029229 A1 | 2/2006 | Trifonov et al. | |
| 2006/0038168 A1 | 2/2006 | Estes et al. | |
| 2006/0159158 A1 | 7/2006 | Moore et al. | |
| 2007/0024504 A1 | 2/2007 | Matsunaga | |
| 2007/0063056 A1 | 3/2007 | Gaucher et al. | |
| 2007/0229270 A1 | 10/2007 | Rofougaran | |
| 2007/0273476 A1 | 11/2007 | Yamazaki et al. | |
| 2007/0278632 A1 | 12/2007 | Zhao et al. | |
| 2008/0089667 A1 | 4/2008 | Grady et al. | |
| 2008/0112101 A1 | 5/2008 | McElwee et al. | |
| 2008/0150799 A1 | 6/2008 | Hemmi et al. | |
| 2008/0150821 A1 | 6/2008 | Koch et al. | |
| 2008/0159243 A1 | 7/2008 | Rofougaran | |
| 2008/0165002 A1 | 7/2008 | Tsuji | |
| 2008/0165065 A1 | 7/2008 | Hill et al. | |
| 2008/0192726 A1 | 8/2008 | Mahesh et al. | |
| 2008/0195788 A1 | 8/2008 | Tamir et al. | |
| 2008/0197973 A1 | 8/2008 | Enguent | |
| 2008/0290959 A1 | 11/2008 | Ali et al. | |
| 2008/0297253 A1 * | 12/2008 | Li et al. | 330/258 |
| 2009/0006677 A1 | 1/2009 | Rofougaran | |
| 2009/0009337 A1 | 1/2009 | Rofougaran | |
| 2009/0037628 A1 | 2/2009 | Rofougaran | |
| 2009/0075688 A1 | 3/2009 | Rofougaran | |
| 2009/0086844 A1 | 4/2009 | Rofougaran | |
| 2009/0094506 A1 | 4/2009 | Lakkis | |
| 2009/0111390 A1 | 4/2009 | Sutton et al. | |
| 2009/0175323 A1 | 7/2009 | Chung | |
| 2009/0218407 A1 | 9/2009 | Rofougaran | |
| 2009/0218701 A1 | 9/2009 | Rofougaran | |
| 2009/0236701 A1 | 9/2009 | Sun et al. | |
| 2009/0239392 A1 | 9/2009 | Sumitomo et al. | |
| 2009/0239483 A1 | 9/2009 | Rofougaran | |
| 2009/0245808 A1 | 10/2009 | Rofougaran | |
| 2009/0280765 A1 | 11/2009 | Rofougaran et al. | |
| 2009/0310649 A1 | 12/2009 | Fisher et al. | |
| 2009/0315682 A1 * | 12/2009 | Leconte et al. | 340/10.1 |
| 2010/0009627 A1 | 1/2010 | Huomo | |
| 2010/0127804 A1 | 5/2010 | Vouloumanos | |
| 2010/0159829 A1 | 6/2010 | McCormack | |
| 2010/0202499 A1 | 8/2010 | Lee et al. | |
| 2010/0231452 A1 | 9/2010 | Babakhani et al. | |
| 2010/0277394 A1 | 11/2010 | Haustein et al. | |
| 2010/0283700 A1 | 11/2010 | Rajanish et al. | |
| 2010/0285634 A1 | 11/2010 | Rofougaran | |
| 2010/0286864 A1 * | 11/2010 | Kawauchi et al. | 701/33 |
| 2010/0297954 A1 | 11/2010 | Rofougaran et al. | |
| 2011/0047588 A1 | 2/2011 | Takeuchi et al. | |
| 2011/0124363 A1 * | 5/2011 | Calvarese et al. | 455/522 |
| 2011/0181484 A1 | 7/2011 | Pettus et al. | |
| 2011/0207425 A1 | 8/2011 | Juntunen et al. | |
| 2011/0285606 A1 | 11/2011 | De Graauw et al. | |
| 2011/0286703 A1 | 11/2011 | Kishima et al. | |
| 2011/0311231 A1 | 12/2011 | Ridgway et al. | |
| 2012/0021800 A1 * | 1/2012 | Wilson et al. | 455/550.1 |
| 2012/0028582 A1 | 2/2012 | Tandy | |
| 2012/0064664 A1 | 3/2012 | Yamazaki et al. | |
| 2012/0069772 A1 | 3/2012 | Byrne et al. | |
| 2012/0082194 A1 | 4/2012 | Tam et al. | |
| 2012/0083137 A1 | 4/2012 | Rohrbach et al. | |
| 2012/0249366 A1 | 10/2012 | Pozgay et al. | |
| 2012/0263244 A1 | 10/2012 | Kyles et al. | |
| 2012/0286049 A1 | 11/2012 | McCormack et al. | |
| 2012/0290760 A1 | 11/2012 | McCormack et al. | |
| 2012/0295539 A1 | 11/2012 | McCormack et al. | |
| 2012/0307932 A1 | 12/2012 | McCormack et al. | |
| 2012/0319496 A1 | 12/2012 | McCormack et al. | |
| 2012/0319890 A1 | 12/2012 | McCormack et al. | |
| 2013/0070817 A1 | 3/2013 | McCormack et al. | |
| 2013/0106673 A1 | 5/2013 | McCormack et al. | |
| 2013/0109303 A1 | 5/2013 | McCormack et al. | |
| 2013/0157477 A1 | 6/2013 | McCormack | |
| 2013/0183903 A1 | 7/2013 | McCormack et al. | |

FOREIGN PATENT DOCUMENTS

| | | |
|---|---|---|
| EP | 1041666 A1 | 10/2000 |
| EP | 1 298 809 A2 | 4/2003 |
| EP | 1357395 A1 | 10/2003 |
| EP | 1798867 A2 | 6/2007 |
| EP | 2 309 608 A1 | 4/2011 |
| EP | 2 360 923 A1 | 8/2011 |
| JP | 2008252566 A | 10/2008 |
| WO | WO 97/32413 A1 | 9/1997 |
| WO | WO 2011/114737 A1 | 9/2011 |
| WO | WO 2011/114738 A1 | 9/2011 |
| WO | WO 2012/129426 A3 | 9/2012 |

(56) References Cited

FOREIGN PATENT DOCUMENTS

| WO | WO 2012/155135 A3 | 11/2012 |
|---|---|---|
| WO | WO 2012/166922 A1 | 12/2012 |
| WO | WO 2012/174350 A1 | 12/2012 |
| WO | WO 2013/006641 A3 | 1/2013 |
| WO | WO 2013/040396 A1 | 3/2013 |
| WO | WO 2013/059801 A1 | 4/2013 |
| WO | WO 2013/090625 A1 | 6/2013 |

OTHER PUBLICATIONS

Eric A. Juntunen, "60 GHz CMOS Pico-Joule/Bit Oook Receiver Design for Multi-Gigabit Per Second Wireless Communications" thesis paper, Aug. 2008, 52 pages.
Murcia Martinez, J., Authorized Officer, European Patent Office, "International Search Report" in connection with related Application Serial No. PCT/US2012/040214, dated Aug. 21, 2012, 3 pages.
Murcia Martinez, J., Authorized Officer, European Patent Office, "Written Opinion of the International Searching Authority" in connection with related Application Serial No. PCT/US2012/040214, dated Aug. 21, 2012, 8 pages.
Ablerga, Vito, Authorized Officer, European Patent Office, "International Search Report" in connection with related Application Serial No. PCT/US2012/042616 dated Oct. 1, 2012, 4 pages.
Ablerga, Vito, Authorized Officer, European Patent Office, "Written Opinion of the International Searching Authority" in connection with related Application Serial No. PCT/US2012/042616 dated Oct. 1, 2012, 10 pages.
Cortes Rosa, Joao, Authorized Officer, European Patent Office, "International Search Report" in connection with related Application No. PCT/US2012/030166, dated Oct. 31, 2010, 6 pages.
Cortes Rosa, Joao, Authorized Officer, European Patent Office, "Written Opinion of the International Searching Authority" in connection with related Application No. PCT/US2012/030166, dated Oct. 31, 2010, 9 pages.
Helms, Jochen, Authorized Officer, European Patent Office, "International Search Report" in connection with related Application No. PCT/US2012/055488, dated Dec. 13, 2012, 4 pages.
Helms, Jochen, Authorized Officer, European Patent Office, "Written Opinion of the International Searching Authority" in connection with related Application No. PCT/US2012/055488, dated Dec. 13, 2012, 8 pages.
Helms, Jochen, Authorized Officer, European Patent Office, "International Search Report" in connection with related Application No. PCT/US2012/045444, dated Jan. 21, 2013, 7 pages.
Helms, Jochen, Authorized Officer, European Patent Office, "Written Opinion of the International Searching Authority" in connection with related Application No. PCT/US2012/045444, dated Jan. 21, 2013, 9 pages.
Helms, Jochen, Authorized Officer, European Patent Office, "International Search Report" in connection with related Application No. PCT/US2012/037795, dated Jan. 21, 2013, 7 pages.
Helms, Jochen, Authorized Officer, European Patent Office, "Written Opinion of the International Searching Authority" in connection with related Application No. PCT/US2012/037795, dated Jan. 21, 2013, 12 pages.
Helms, Jochen, Authorized Officer, European Patent Office, "International Search Report" in connection with related Application No. PCT/US2012/061345, dated Jan. 24, 2013, 4 pages.
Helms, Jochen, Authorized Officer, European Patent Office, "Written Opinion of the International Searching Authority" in connection with related Application No. PCT/US2012/061345, dated Jan. 24, 2013, 7 pages.
Franz, Volker, Authorized Officer, European Patent Office, "International Search Report" in connection with related Application No. PCT/US2012/061346, dated Jan. 24, 2013, 5 pages.
Franz, Volker, Authorized Officer, European Patent Office, "Witten Opinion of the International Searching Authority" in connection with related Application No. PCT/US2012/061346, dated Jan. 24, 2013, 9 pages.
Bouhana, Emmanuel, Authorized Officer, European Patent Office, "International Search Report" in connection with related Application No. PCT/US2012/069576, dated May 2, 2013, 3 pages.
Bouhana, Emmanuel, Authorized Officer, European Patent Office, "Written Opinion of the International Searching Authority" in connection with related Application No. PCT/US2012/069576, dated May 2, 2013, 13 pages.
Office of Engineering and Technology Federal Communications Commission, "Understanding the FCC Regulations for Low-Power, Non-Licensed Transmitters", OET Bulletin No. 63, Oct. 1993, 34 pages.
Vahle Electrification Systems, "CPS Contactless Power System", Catalog No. 9d/E, 2004, 12 pages.
Future Technology Devices International Limited (FTDI), "Technical Note TN._113 Simplified Description of USB Device Enumeration", Doc. Ref. No. FT_000180, Version 1.0, Issue Date Oct. 28, 2009, 19 pages.
Lee W. Young, Authorized Officer, U.S. Patent and Trademark Office, "International Search Report" in connection with related PCT Patent App. No. PCT/US2013/027835, dated May 3, 2013, 4 pages.
Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.
Marquez, T. Lopez, Authorized Officer, European Patent Office, "International Search Report" in connection with related PCT Patent App. No. PCT/US2013/029469, dated Jun. 6, 2013, 5 pages.
Marquez, T. Lopez, Authorized Officer, European Patent Office, "Written Opinion of the International Searching Authority" in connection with related PCT Patent App. No. PCT/US2013/029469, dated Jun. 6, 2013, 5 pages.
Jochen Helms, Authorized Officer, European Patent Office, "International Search Report" in connection with related PCT Patent App. No. PCT/US2013/023665, dated Jun. 20, 2013, 5 pages.
Jochen Helms, Authorized Officer, European Patent Office, "Written Opinion of the International Searching Authority" in connection with related PCT Patent App. No. PCT/US2013/023665, dated Jun. 20, 2013, 10 pages.
Chinese Second Office Action, Chinese Application No. 201380023808.5, Jan. 28, 2016, 10 pages.

\* cited by examiner

US 9,300,349 B2

EXTREMELY HIGH FREQUENCY (EHF) COMMUNICATION CONTROL CIRCUIT

RELATED APPLICATION

This application claims the benefit of U.S. Provisional Application No. 61/607,379, filed Mar. 6, 2012 and entitled TEST AND TRIM METHOD AND DEVICE, which application is incorporated herein by reference in its entirety for all purposes.

This application is a continuation of co-pending U.S. application Ser. No. 13/787,789, filed Mar. 6, 2013, and entitled SYSTEM FOR CONSTRAINING AN OPERATING PARAMETER OF AN EHF COMMUNICATION CHIP, which is incorporated by reference in its entirety.

FIELD OF THE INVENTION

The present disclosure relates to electronic systems and devices, and more specifically to chip-based test and trim systems and devices.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Unfortunately, such connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

In light of above discussion, there exists a need for improved connectors that maybe used in various electronic devices.

BRIEF SUMMARY

An embodiment of the present invention provides an EHF communication system including an EHF communication chip. The EHF communication chip may include an EHF communication circuit having at least one controllable parameter-based module having a testable and controllable operating parameter The EHF communication chip may further include a test and trim circuit coupled to the EHF communication circuit, where the test and trim circuit includes a logic circuit having one or more memory elements, where the logic circuit is coupled to the controllable parameter-based module.

An alternative embodiment of the present invention provides an EHF communication system that includes an EHF communication circuit responsive to a control setting, and which operates initially at an initial EHF carrier frequency. The EHF communication system further includes a test circuit configured to determine a difference between the initial EHF carrier frequency and a preselected reference carrier frequency, to generate a temporary control setting for the EHF communication circuit configured to adjust the carrier frequency of the EHF communication circuit from the initial EHF carrier frequency to an adjusted EHF carrier frequency within a preselected frequency range including the reference carrier frequency, and to apply the temporary control setting to the EHF communication circuit. The EHF communication system yet further includes a memory circuit coupled to the EHF communication circuit and configured to permanently apply the temporary control setting to the EHF communication circuit.

An additional alternative embodiment of the present invention provides an EHF communication system that includes an EHF communication circuit responsive to a control setting and operating initially at an initial EHF emissions level. The EHF communication system further includes a test circuit configured to determine a difference between the initial EHF emissions level and a preselected reference EHF emissions level, to generate a temporary control setting for the EHF communication circuit configured to adjust the EHF emissions level of the EHF communication circuit from the initial EHF emissions level to an adjusted EHF emissions level within a preselected emissions level range of the reference EHF emissions level, and to apply the temporary control setting to the EHF communication circuit. The EHF communication system yet further includes a memory circuit coupled to the EHF communication circuit and configured to permanently apply the temporary control setting to the EHF communication circuit.

BRIEF DESCRIPTION OF THE SEVERAL VIEWS OF THE DRAWINGS

Figure 1:
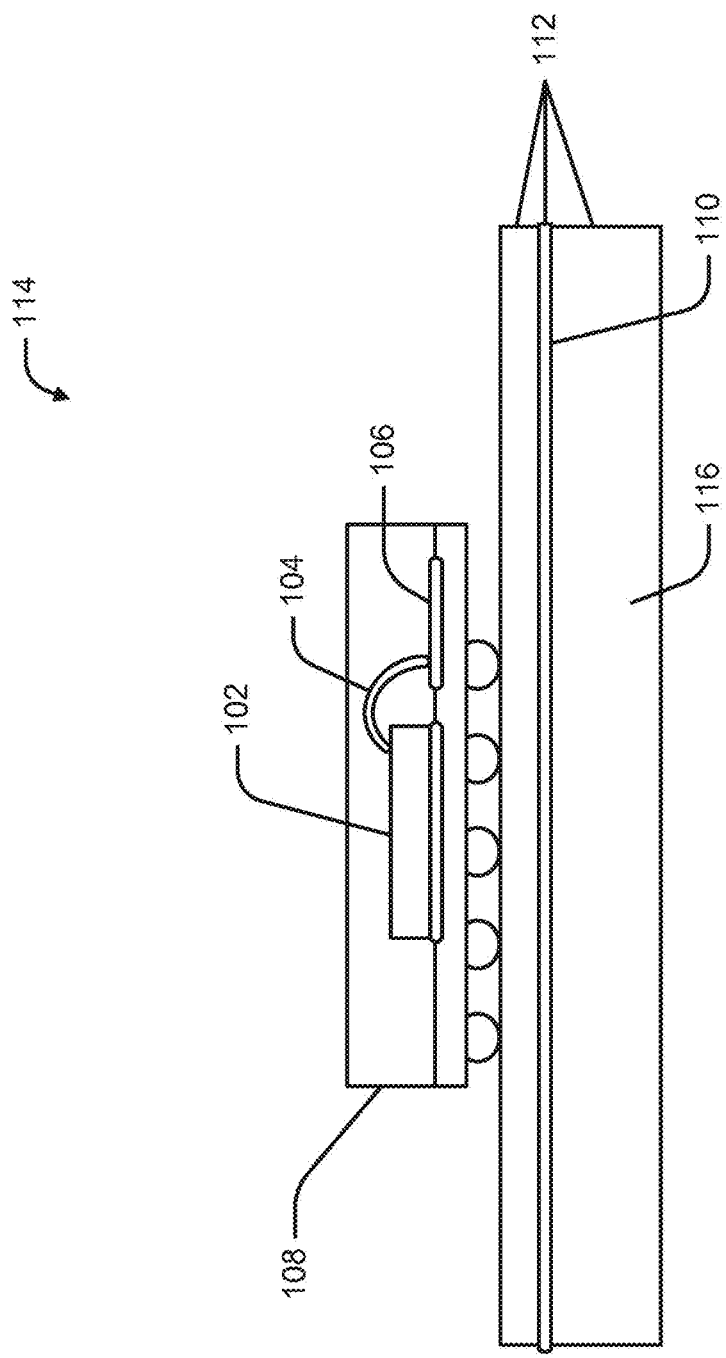
Figure 2:
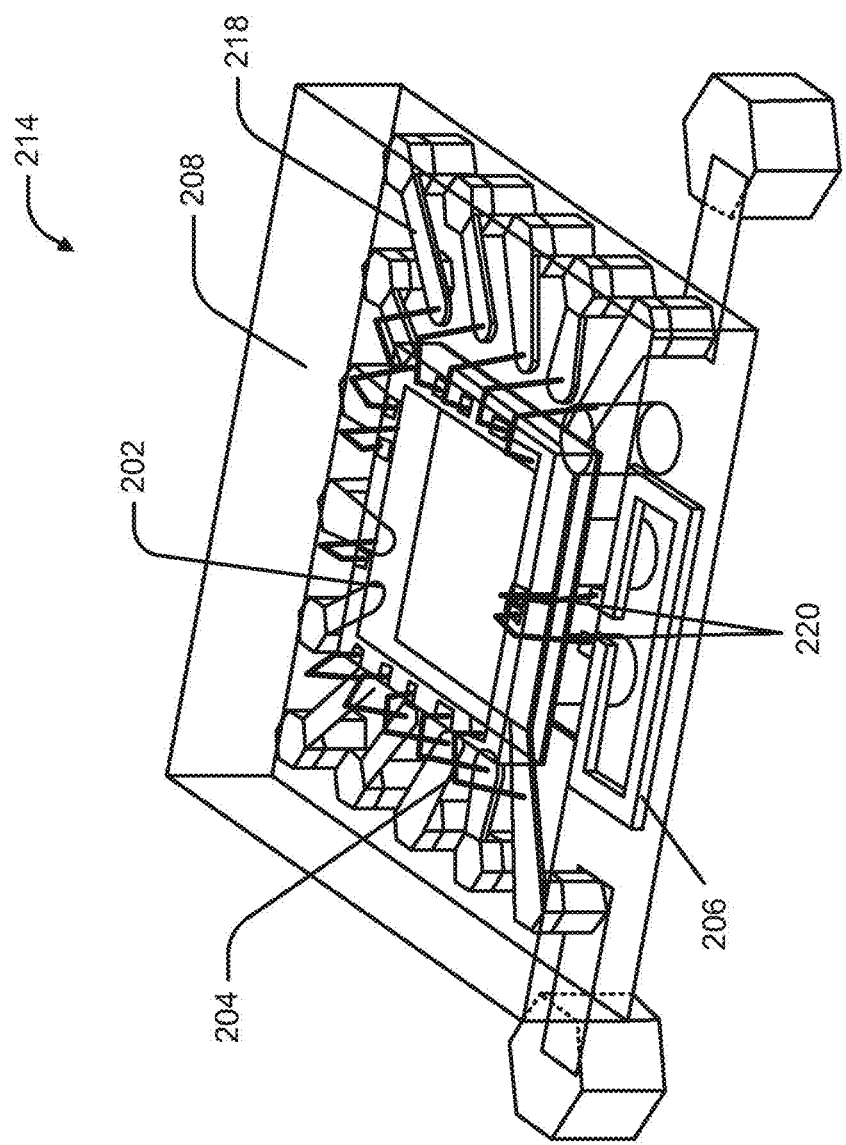
Figure 3:
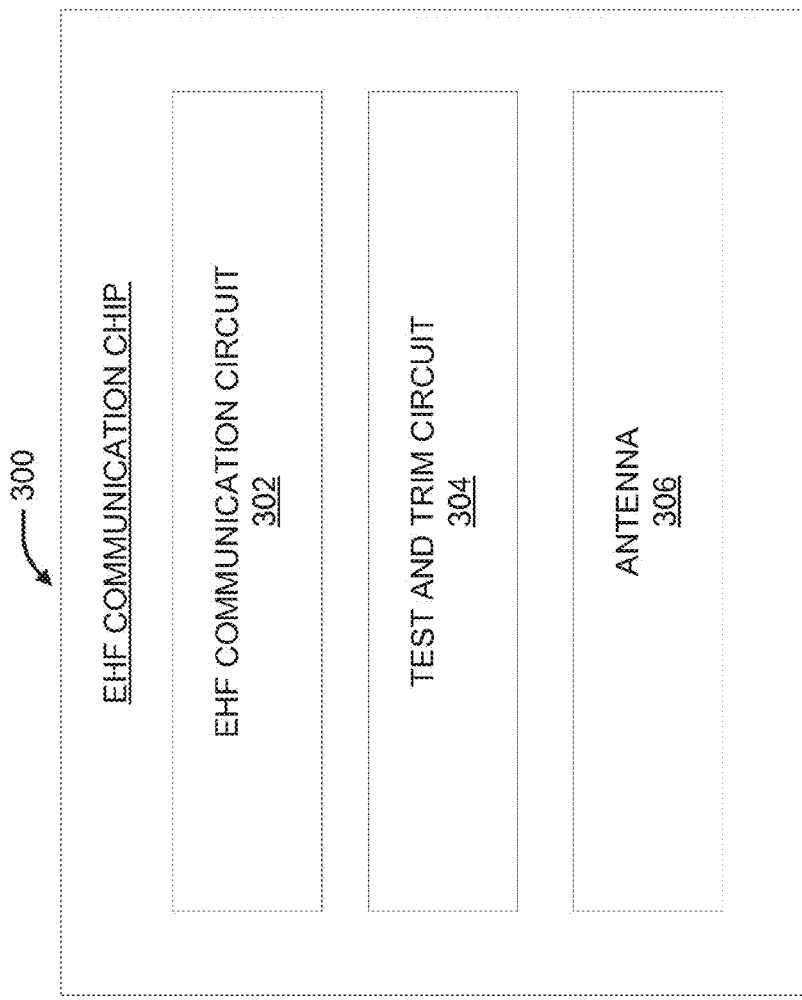

Having thus described the invention in general terms, reference will now be made to the accompanying drawings, which are not necessarily drawn to scale, and wherein:

FIG. 1 is side view of an EHF communication chip showing some internal components, in accordance with an embodiment of the present invention;

FIG. 2 is an isometric view of the EHF communication chip of FIG. 1;

FIG. 3 is a block diagram illustrating system elements of the EHF communication chip, in accordance with an embodiment of the present invention.

Figure 4:
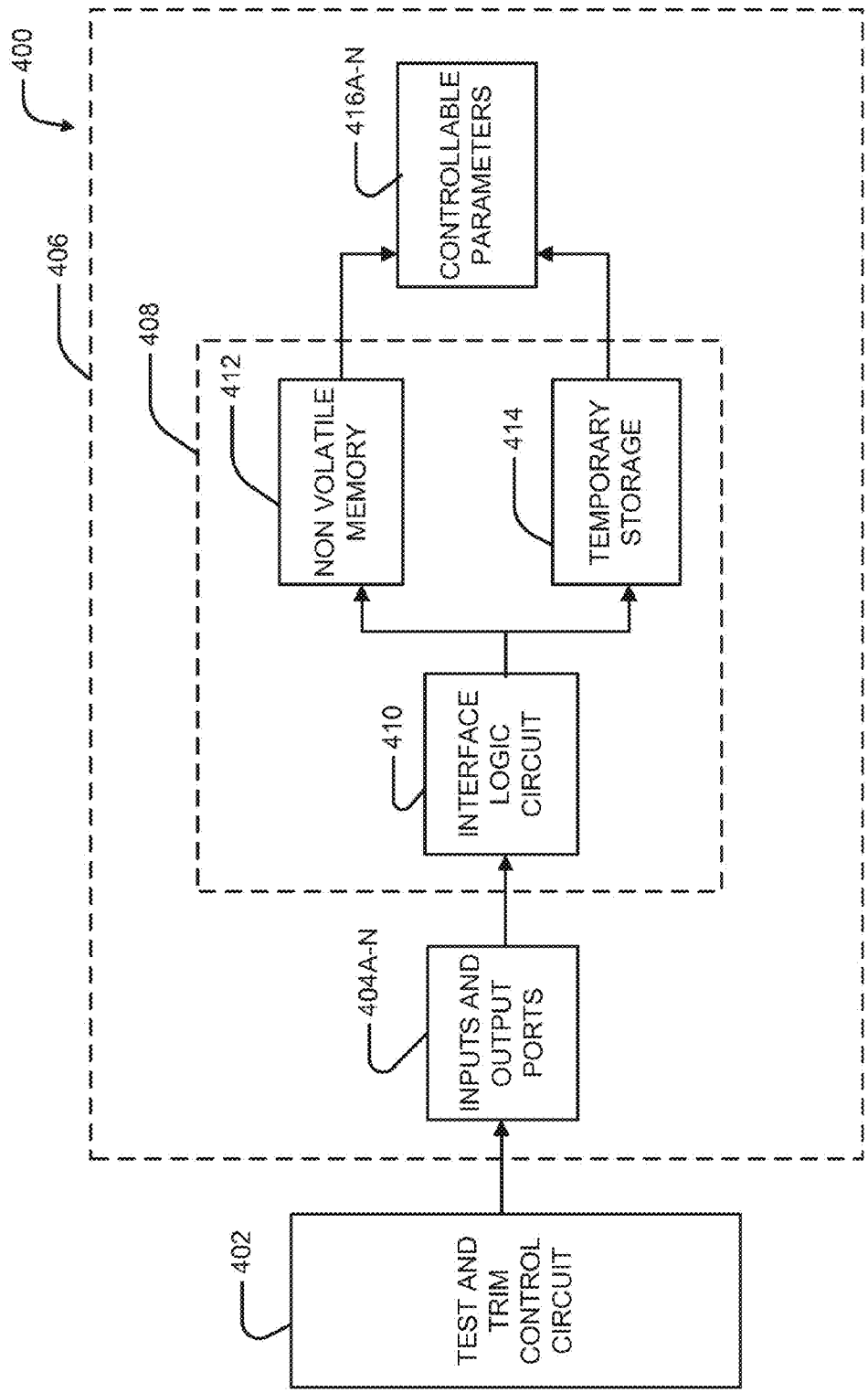

FIG. 4 is functional block diagram of a portion of an illustrative EHF communication chip showing a test and trim circuit.

Figure 5:
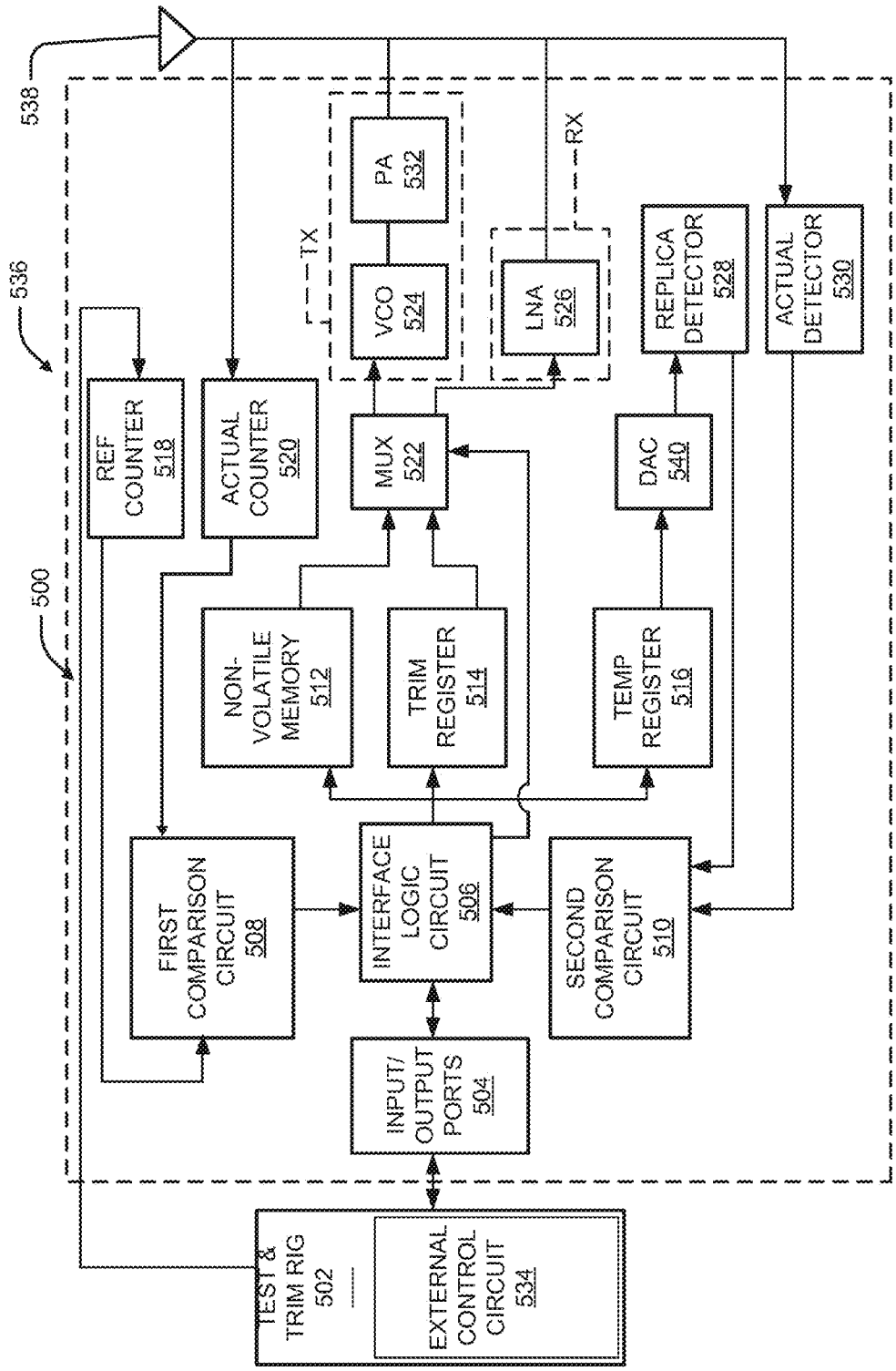
Figure 6A:
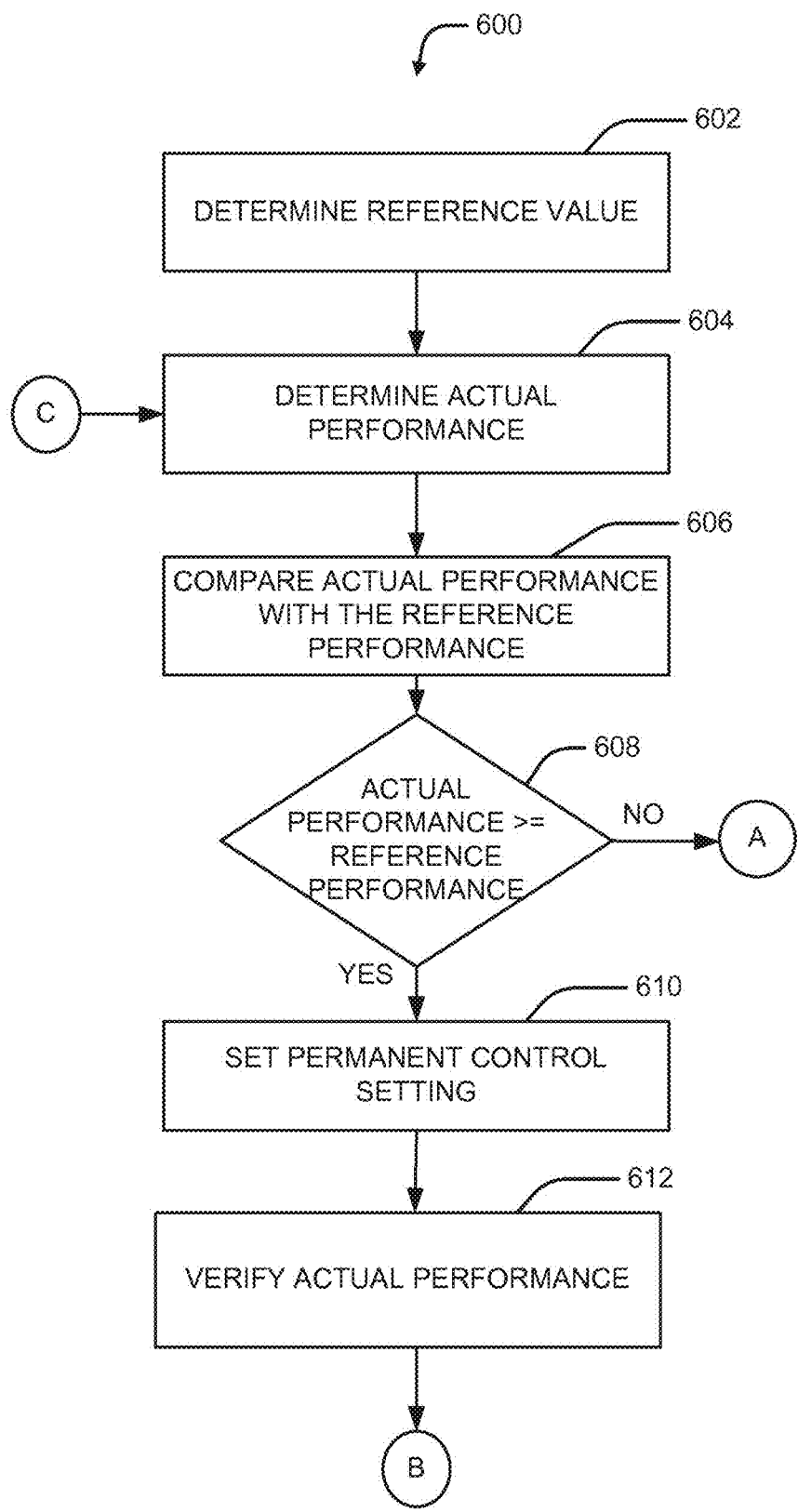
Figure 6B:
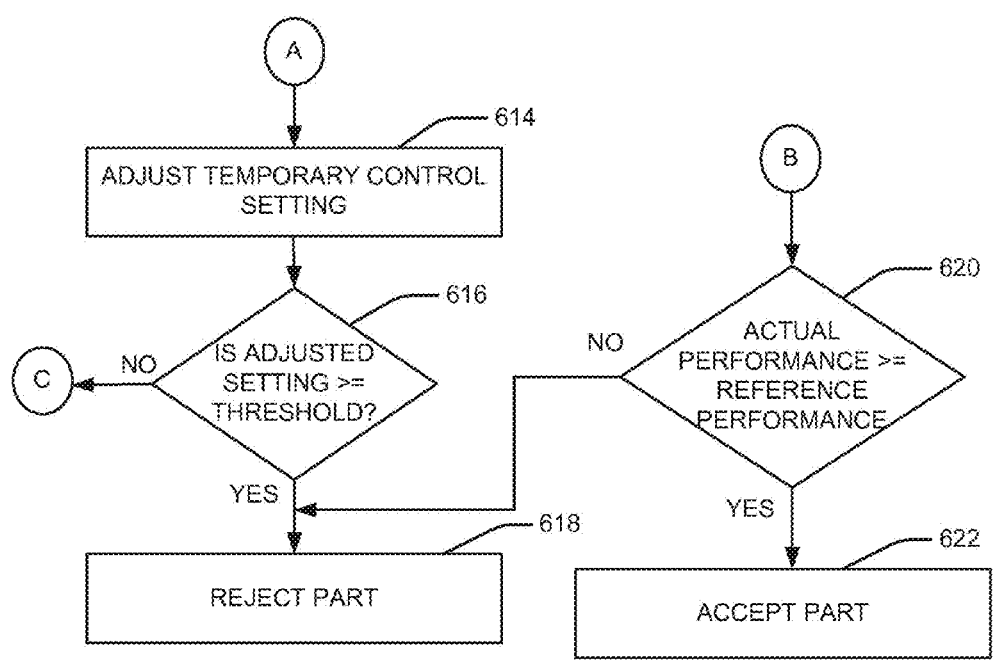

FIG. 5 is a block diagram of a portion of another illustrative EHF communication chip showing a test and trim circuit in relation to other circuits; and FIGS. 6A-6B are flow charts illustrating an exemplary method for testing and setting a parameter on an EHF communication chip having a test and trim circuit.

DETAILED DESCRIPTION

Illustrative embodiments of the invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

The detrimental characteristics of conventional connectors lead to degradation of signal integrity and corresponding instability of electronic systems that are designed to transfer data at very high rates, which in turn limits the utility of such systems. Methods and systems are needed for coupling discontinuous portions of high-data-rate signal paths without the cost and power consumption associated with insertable physical connectors and equalization circuits. Additionally, methods and systems are needed to ensure that such solutions are easily manufactured, modular, and efficient.

Examples of such systems are disclosed in U.S. Pat. No. 5,621,913 and U.S. patent application Ser. No. 12/655,041. The disclosures of these and all other publications referenced herein are incorporated by reference in their entirety for all purposes.

Furthermore, in today's society and ubiquitous computing environment, high-bandwidth modular and portable memory devices are being used increasingly. Methods are therefore desirable for ensuring security and stability of communication between and within these devices. In order to provide improved secure high-bandwidth communications, the unique capabilities of EHF communications units may be utilized in innovative and useful arrangements.

An example of an EHF communications unit is an EHF comm-link chip. Throughout this disclosure, the terms comm-link chip, comm-link chip package, EHF communications unit, and EHF communication link chip package will be used interchangeably to refer to EHF antennas embedded in IC packages. Examples of such comm-link chips are described in detail in U.S. Provisional Patent Application Ser. Nos. 61/491,811, 61/467,334, and 61/485,1103, all of which are hereby incorporated in their entireties for all purposes.

FIG. 1 is a side view of an exemplary extremely high frequency (EHF) communication chip 114 showing some internal components, in accordance with an embodiment. As discussed with reference to FIG. 1, the EHF communication chip 114 may be mounted on a connector printed circuit board (PCB) 116 of the EHF communication chip 114. FIG. 2 shows a similar illustrative EHF communication chip 214. It is noted that FIG. 1 portrays the EHF communication chip 114 using computer simulation graphics, and thus some components may be shown in a stylized fashion. The EHF communication chip 114 may be configured to transmit and receive extremely high frequency signals. As illustrated, the EHF communication chip 114 can include a die 102, a lead frame (not shown), one or more conductive connectors such as bond wires 104, a transducer such as antenna 106, and an encapsulating material 108. The die 102 may include any suitable structure configured as a miniaturized circuit on a suitable die substrate, and is functionally equivalent to a component also referred to as a "chip" or an "integrated circuit (IC)." The die substrate may be formed using any suitable semiconductor material, such as, but not limited to, silicon. The die 102 may be mounted in electrical communication with the lead frame. The lead frame (similar to 218 of FIG. 2) may be any suitable arrangement of electrically conductive leads configured to allow one or more other circuits to operatively connect with the die 102. The leads of the lead frame (See 218 of FIG. 2) may be embedded or fixed in a lead frame substrate. The lead frame substrate may be formed using any suitable insulating material configured to substantially hold the leads in a predetermined arrangement.

Further, the electrical communication between the die 102 and leads of the lead frame may be accomplished by any suitable method using conductive connectors such as, one or more bond wires 104. The bond wires 104 may be used to electrically connect points on a circuit of the die 102 with corresponding leads on the lead frame. In another embodiment, the die 102 may be inverted and conductive connectors including bumps, or die solder balls rather than bond wires 104, which may be configured in what is commonly known as a "flip chip" arrangement.

The antenna 106 may be any suitable structure configured as a transducer to convert between electrical and electromagnetic signals. The antenna 106 may be configured to operate in an EHF spectrum, and may be configured to transmit and/or receive electromagnetic signals, in other words as a transmitter, a receiver, or a transceiver. In an embodiment, the antenna 106 may be constructed as a part of the lead frame (see 218 in FIG. 2). In another embodiment, the antenna 106 may be separate from, but operatively connected to the die 102 by any suitable method, and may be located adjacent to the die 102. For example, the antenna 106 may be connected to the die 102 using antenna bond wires (similar to 220 of FIG. 2). Alternatively, in a flip chip configuration, the antenna 106 may be connected to the die 102 without the use of the antenna bond wires (see 220). In other embodiments, the antenna 106 may be disposed on the die 102 or on the PCB 116.

Further, the encapsulating material 108 may hold the various components of the EHF communication chip 114 in fixed relative positions. The encapsulating material 108 may be any suitable material configured to provide electrical insulation and physical protection for the electrical and electronic components of first EHF communication chip 114. For example, the encapsulating material 108 may be a mold compound, glass, plastic, or ceramic. The encapsulating material 108 may be formed in any suitable shape. For example, the encapsulating material 108 may be in the form of a rectangular block, encapsulating all components of the EHF communication chip 114 except the unconnected leads of the lead frame. One or more external connections may be formed with other circuits or components. For example, external connections may include ball pads and/or external solder balls for connection to a printed circuit board.

Further, the EHF communication chip 114 may be mounted on a connector PCB 116. The connector PCB 116 may include one or more laminated layers 112, one of which may be PCB ground plane 110. The PCB ground plane 110 may be any suitable structure configured to provide an electrical ground to circuits and components on the PCB 116.

FIG. 2 is a perspective view of an EHF communication chip 214 showing some internal components. It is noted that FIG. 2 portrays the EHF communication chip 214 using computer simulation graphics, and thus some components may be shown in a stylized fashion. As illustrated, the EHF communication chip 214 can include a die 202, a lead frame 218, one or more conductive connectors such as bond wires 204, a transducer such as antenna 206, one or more antenna bond wires 220, and an encapsulating material 208. The die 202, the lead frame 218, one or more bond wires 204, the antenna 206, the antenna bond wires 220, and the encapsulating material 208 may have functionality similar to components such as the die 102, the lead frame, the bond wires 104, the antenna 106, the antenna bond wires, and the encapsulating material 108 of the EHF communication chip 114 as described in FIG. 1. Further, the EHF communication chip 214 may include a connector PCB (similar to PCB 116).

In FIG. 2, it may be seen that the die 202 is encapsulated in the EHF communication chip 214, with the bond wires 204 connecting the die 202 with the antenna 206. In this embodiment, the EHF communication chip 214 may be mounted on the connector PCB. The connector PCB (not shown) may include one or more laminated layers (not shown), one of which may be PCB ground plane (not shown). The PCB ground plane may be any suitable structure configured to provide an electrical ground to circuits and components on the PCB of the EHF communication chip 214.

With continuing references to FIGS. 1-2, the EHF communication chip 214 may be included and configured to allow EHF communication with the EHF communication chip 114. Further, either of the EHF communication chips 114 or 214 may be configured to transmit and/or receive electromagnetic signals, providing one or two-way communication between the EHF communication chip 114 and the EHF communication chip 214 and accompanying electronic circuits or components. In an embodiment, the EHF communication chip 114 and the EHF communication chip 214 may be co-located on the single PCB and may provide intra-PCB communication. In another embodiment, the EHF communication chip 114 may be located on a first PCB (similar to PCB 116) and the EHF communication chip 214 may be located on a second PCB (similar to PCB 116) and may therefore provide inter-PCB communication.

Regardless of where the EHF communication chips 114 and 214 are mounted, it remains important to provide improved signal security and integrity when communicating between any two EHF communication chips. One method for enhancing or ensuring proper signal security and integrity is to verify that the EHF communication chip 214 is within a predetermined range before or during a communication attempt. To that end, systems and methods for detecting the presence of the EHF communication chip 214 and/or for ensuring another device or surface is within a certain distance may be included. Examples of such systems and methods are described in U.S. Provisional Patent Application Ser. No. 61/497,192, which is hereby incorporated in its entirety for all purposes.

FIG. 3 is a block diagram illustrating system elements of an extremely high frequency communication chip 314, in accordance with an embodiment of the present disclosure. The EHF communication chip 314 is configured to transmit or/and receive EHF signals. As shown, the EHF communication chip 314 may include an EHF communication circuit 302, a test and trim circuit 304 and an antenna 306. The structure and system elements of the EHF communication chip 314 are already described in detail in FIGS. 1-2.

The EHF communication circuit 302 may be configured to convert between modulated digital signals and demodulated digital signals at or near a desired EHF frequency, or within a preselected range of EHF frequencies. Alternatively, or in addition, the EHF communication circuit 302 may be configured to modulate a digital signal into a modulated EHF signal having a desired emissions level, or an emissions level falling within a preselected range of emissions levels, or to demodulate a modulated EHF signal having a preselected emissions level into a digital signal. The EHF communication circuit 302 may include at least one controllable parameter-based module having a testable and controllable operating parameter. In one embodiment of the invention the controllable parameter-based module is configured to control an emissions level of the EHF communication circuit. In an alternative embodiment of the invention, the EHF communication circuit 302 is configured to operate without an input from an external reference clock. The antenna 306 is coupled to the EHF communication circuit and may be configured to transduce between electrical signals and electromagnetic signals at a desired EHF frequency. The test and trim circuit may be coupled to the EHF communication circuit 302. The system elements of the test and trim circuit 304 are described in detail in subsequent FIGS. 4-5.

Turning to FIG. 4, a functional block diagram is depicted showing various components of a test and trim circuit 406 (or 304 of FIG. 1). The test and trim circuit 406 may be incorporated entirely or partially on the die 102 of the EHF communication chip 114, and may include a test-and-trim control circuit 402 external to the EHF communication chip 114, a number of input and output (I/O) ports 404A-N, which provide an interface for communication between the test-and-trim control circuit 402 and a logic circuit or circuits 408. The logic circuit 408 may include a non-volatile memory 412 and a temporary data register 414. As discussed with reference to FIG. 3, the logic circuit 408 may be coupled to the controllable parameter-based module having a testable and controllable operating parameter. The logic circuit 408 may be in communication with one or more controllable parameters 416A-N, such as power level, amplifier gain, and/or oscillator frequency.

In one embodiment of the invention, the test and trim circuit 406 may include a memory circuit coupled to the EHF communication circuit, where the memory circuit is configured to control the controllable operating parameter of the EHF communication circuit. The test and trim circuit may further include a test circuit coupled to the at least one controllable parameter-based module, where the test circuit is configured to monitor the operation of the controllable parameter-based module.

The test and trim circuit 406 may further include an interface configured to operatively connect an external control circuit (See FIG. 5) to the logic circuit 408. The external control circuit may be configured to control operation of the test and trim circuit 406. The interface may include various I/O ports 404A-N that can incorporate any of a number of conventional input/output pins or tabs or other physical interfaces for connecting an external device incorporating the external control circuit, in order to control the operation of test and trim circuit 406 by providing a signal to, or receiving a signal from the circuit. For example, the EHF communication chip 114 (or 214) may be mounted on a test board, which may be operatively connected to the test and trim circuit 406 through the I/O ports 404A-N. The I/O ports 404A-N may provide communication with the logic circuit 408.

The logic circuit 408 in turn may include, for example, an interface logic circuit 410 for interfacing with the non-volatile memory 412 and the temporary data storage component such as, but not limited to, the temporary storage register 414. The interface logic circuit 410 may be configured as a serial peripheral interface bus (SPI), or may utilize some other communication mode. The interface logic circuit 410 may provide a route for externally controlling digital information stored in the temporary storage component or register 414 and in the non-volatile memory 412. In one embodiment, the logic circuit 405 is configured to copy stored content from non-volatile memory 412 to the temporary storage register 414.

The logic circuit 408 may be configured to determine a desired or optimal setting for one or more of the controllable operating parameters 416, and to permanently fix that operating parameter at the desired setting. Any suitable method for permanently setting an operating parameter of the EHF communication circuit is an appropriate method for the purposes of the present invention. For example, the non-volatile memory 412 may include one or more selectively blowable fuses (not shown), the state of which may determine a setting for one or more of the controllable parameters 416. A parameter value may be stored in the non-volatile memory by selectively blowing one or more of the fuses. A separate portion of the non-volatile memory 412 may be dedicated to each of the controllable parameters.

Both temporary data storage component 414 and non-volatile memory 412 may each be in communication with at least one controllable parameter-based module (not shown) of the EHF communication circuit (See 302 of FIG. 3). Accordingly, either component 412 or 414 may control any given parameter. As described below, this arrangement allows testing of various settings as well as experimentation after a final setting has been selected.

FIG. 5 depicts a more specific example of a portion of a test and trim circuit 500 (or 406 of FIG. 4) at least a portion of which may be resident on the EHF communication chip, generally indicated as 536 in this figure. The EHF communication chip 536 may include an EHF communication circuit (See FIG. 3), a test and trim circuit 500 and an antenna (See FIG. 3). The EHF communication circuit may include at least one controllable parameter-based module having an associated testable and controllable operating parameter. Further, the test and trim circuit 500 may be part of a system for constraining an operating parameter of an EHF communication chip 114. The system may include a test and trim rig 502 including an external control circuit 534. The external control circuit 534 may be configured to control operation of the test and trim circuit 500. The test and trim rig 502 may be operatively connected to the interface of the EHF communication chip (i.e. 114 or 214).

In this example, various I/O interface ports 504 are provided, allowing an external control circuit 534 to physically interface with an interface logic circuit 506. The interface logic circuit 506 may be an SPI interface logic circuit, and may be in communication with one or more temporary data storage components, such as trim register(s) 514, and a non-volatile memory 512. The trim register(s) 514 and non-volatile memory 512 may in turn feed a multiplexer (MUX) 522, the operation of which may be controlled by interface logic circuit 506 to select which memory component signal is passed through the multiplexer 522. The MUX 522 may be configured to select between the trim register(s) 514 and the non-volatile memory 516, placing the selected memory component in communication with the one or more controllable parameters (See 416A-N in FIG. 4).

Further, the test and trim circuit 500 may further include an interface configured to operatively connect an external control circuit to the interface logic circuit 506. In one embodiment of the invention, the frequency of signal is testable and controllable by the external control circuit 534 in the absence of the reference clock or reference counter 518. In addition, an operating parameter of the EHF communication circuit (302 of FIG. 3) can be tested and controlled by the external control circuit 534 in the absence of a reference clock or reference counter 518. The operating parameter is controlled by a signal that is representative of a parameter value stored in one of the non-volatile memory 512 and a temporary data register 516. The non-volatile memory 512 may further include a number of fuses, and a parameter value may be stored in the non-volatile memory 512 by selectively blowing one or more of the fuses.

The at least one controllable parameter-based module may include any of a variety of chip-based modules that may alter the operation of the EHF communication circuit in a detectable way. Typically, the controllable parameter-based module is selected from those modules that effect one or more aspects of the modulation, transmission, reception, or demodulation of an EHF signal by the EHF communication circuit.

In one embodiment of the invention, the controllable parameter-based module may be configured to control the emissions level or transmit power of the EHF communication circuit. In this embodiment, the controllable parameter-based module of the EHF communication circuit (See 304) may control a power amplifier (PA) 532 and the testable and controllable operating parameter of the PA 532 may be a transmit power.

Alternatively, or in addition, the controllable parameter-based module of the EHF communication circuit may be configured to control the signal frequency, or carrier frequency, of the EHF communication chip, such as where the controllable parameter-based module of the EHF communication circuit (See 304) includes an electronic oscillator, such as a voltage-controlled oscillator (VCO) 524. In this embodiment, the testable and controllable operating parameter of the voltage-controlled oscillator 524 may be a carrier frequency.

Typically, the controllable parameters may include, for example, the generation of a signal having a frequency by a voltage-controlled oscillator 524, a power level of a signal output by the power amplifier (PA) 532, and/or a gain level associated with a low-noise amplifier (LNA) 526. Further, the at least one controllable parameter-based module may include the LNA 526 and the testable and controllable operating parameter of the LNA 526 may be a gain level. Additionally, the VCO 524 and the PA 532 may be part of a larger circuit that accepts an input signal TX from a transmission circuit (not shown) and passes that signal to a shared antenna 538. Likewise, the LNA 528 may be part of a larger circuit that accepts a received signal from the antenna 538 and passes it as an amplified signal RX on to a reception circuit (not shown). Accordingly, the test and trim circuit 500 may act in concert with or as a portion of a functioning transceiver circuit.

The at least one controllable parameter-based module may include a power amplifier (PA) 532 and the testable and controllable operating parameter of the PA 532 may be an emissions level. The at least one controllable parameter-based module of the EHF communication circuit (See 304) may include a voltage-controlled oscillator (VCO) 524. Further, the testable and controllable operating parameter of the voltage-controlled oscillator 524 may be a carrier frequency. The controllable parameters may include, for example, the generation of a signal having a frequency by a voltage-controlled oscillator 524, a power level of a signal output by the power amplifier (PA) 532, and/or a gain level associated with a low-noise amplifier (LNA) 526. Further, the at least one controllable parameter-based module may include the LNA 526 and the testable and controllable operating parameter of the LNA 526 may be a gain level. Additionally, the VCO 524 and the PA 532 may be part of a larger circuit that accepts an input signal TX from a transmission circuit (not shown) and passes that signal to a shared antenna 538. Likewise, the LNA 528 may be part of a larger circuit that accepts a received signal from the antenna 538 and passes it as an amplified signal RX on to a reception circuit (not shown). Accordingly, the test and trim circuit 500 may act in concert with or as a portion of a functioning transceiver circuit.

With continuing reference to FIG. 5, various components may be included in test and trim circuit 500 to facilitate measurement and adjustment of the one or more controllable parameter-based module(s) previously discussed. For example, external test and trim control rig 502 may provide a standard clock signal to drive a reference counter 518, while an actual counter 520 may be driven by the output of VCO 526. The reference counter 518 and the actual counter 520 may be compared by a first comparison circuit 508, which may provide the results of that comparison to the interface logic circuit 506. Accordingly, the external test and trim control rig 502 may have access to the comparison results via the I/O ports 504. In one embodiment of the invention, external test and trim control rig 502 may provide a standard clock signal in order to facilitate the adjustment of one or more controllable parameter-based modules, which modules would subsequently be capable of operation without the necessity of a reference clock. For example, VCO 526, once calibrated, may not require a signal from a reference clock, but may rely upon one or more stored settings.

Likewise, the interface logic circuit 506 may be in communication with another temporary register 516 that drives a digital-to-analog converter (DAC) 536. The DAC 536 may provide a resulting analog signal to a replica detector 528, which may measure a value of the provided signal. An actual detector 530 may detect a power or gain parameter value at a port of the antenna 538, and may communicate that value to a second comparison circuit 510, where it may be compared to the value detected by the replica detector 528. The results of the comparison may be made available to the test and trim rig 502 via the interface logic circuit 506 and the I/O ports 504.

Based on the results of these comparisons, one or more of the parameters of the controllable parameter-based module(s) may be adjusted by changing values stored in the trim register(s) 514 until acceptable comparison results are achieved based on predetermined criteria. At that point, a known acceptable setting exists, and the parameter-based function may have a permanent setting entered by causing the non-volatile memory 512 to contain the same value. The MUX 522 may then be dynamically configured to selectively place the non-volatile memory 512 in communication with the at least one controllable parameter-based module.

It is noted, however, that the parameter-based function in question remains in potential communication with both the trim register(s) 514 and the non-volatile memory 512 via MUX 522. Through this mechanism, at least two channels of control are possible for each of the controllable parameter-based functions. This may allow temporary control of a controllable parameter for processes such as testing and experimentation, while also providing a more permanent setting of the parameter via the non-volatile memory. Because the MUX 522 remains in communication with both the temporary trim register(s) 514 and the non-volatile memory 512 even after a permanent setting has been established, the testing and experimentation options remain available.

Turning to FIGS. 6A-6B, a test and trim method, generally indicated at 600, is described that may utilize a test and trim circuit 500. The method 600 may be implemented during manufacture of EHF communication chips to ensure uniformity of manufacture and to establish quality control and assurance. In general, method 600 may be used to test EHF comm-link chips and account for issues such as natural variation by trimming certain parameters to match reference values within an acceptable tolerance level.

At step 602, a reference value for the given parameter is determined. This may be accomplished by any suitable means. For example, a reference value for a frequency generated by an oscillator may be provided by a reference counter. In one embodiment of the invention, the reference value corresponds to a discrete value, such as a selected carrier frequency, or a selected emissions level. Alternatively, the reference value may correspond to a range of acceptable values, such as a range of carrier frequencies, or a range of emissions levels.

At step 604, an actual performance for the parameter based function in question is determined. In the example of a frequency, a signal output from a frequency-controlled oscillator on an EHF communication chip may be input to a second counter in order to provide a value indicating actual performance.

At step 606, the actual performance is compared with the reference value. At step 608, it is checked whether the actual performance is greater than or equal to the reference value. Alternatively, or in addition, the actual performance may be compared with a reference value that is a discrete value, or the actual performance may be compared with an acceptable range of reference values, to determine if the actual performance lies within the acceptable range. In yet another embodiment, the actual performance is compared to a single reference value, and the difference between the actual performance and the reference value is determined. At step 608, a determination may be made regarding the acceptability of the comparison of step 606. If the actual performance is outside a predefined tolerance level relative to the reference level, the comparison may indicate that the actual performance is not acceptable. If it is not acceptable, then at step 614 a temporary control setting may be adjusted to alter the actual performance. This temporary control setting may be accomplished using, for example, the temporary data storage registers (See 516) of test and trim circuit (i.e. 500) previously described in FIG. 5. Because excessive adjustment of the setting may not be desirable, and may exceed the capabilities of the test and trim circuit to modify the subject parameter, and/or may indicate a faulty part, step 616 may include comparing the setting adjustment to a threshold value. The threshold value may define a maximum allowable or available adjustment level. If the adjustment setting is either greater than or equal to the threshold value then, the part may be rejected at step 618. If not at step 616, then the actual performance is again analyzed in step 604.

If step 608 instead results in a favorable determination, the setting for the parameter in question may be considered to be adequate. Accordingly, in step 610, a permanent control setting may be set corresponding to the temporary setting that has been determined to be acceptable. This may be accomplished by, but is not limited to, selectively blowing predetermined fuses in a non-volatile memory such as non-volatile memory (i.e. 512), previously described in FIG. 5. Once this setting has been established, the actual performance may again be checked in step 612. A comparison is again made in step 620 to determine acceptability, and the part is either accepted at step 622 or rejected at step 618 based on that determination.

The present disclosure also provides a method including providing an EHF communication chip with a parameter capable of being controlled by a temporary digital setting and by a permanent digital setting. The method may include comparing an actual value of the parameter to a reference value of the parameter. The method may further include adjusting the temporary digital setting to alter the actual value of the parameter until the difference between the actual value and the reference value is acceptable in response to an unacceptable difference between the actual value of the parameter and the reference value of the parameter. The method may also include causing the permanent digital setting to contain a value corresponding to the adequate setting in response to determining that a temporary digital setting is adequate. The method may also allow the temporary digital setting to remain selectable in control of the parameter after the permanent digital setting is set to a value. Further, an EHF communication chip may be provided with a parameter by providing the EHF communication chip with a function having a controllable frequency as a parameter. Similarly, comparing an actual value of the parameter to a reference value of the parameter may include comparing a value of a first counter slaved to the frequency parameter to a value of a second counter used as a reference. In an embodiment, providing an EHF communication chip with a parameter includes providing an EHF communication chip with a power parameter. Also, comparing an actual value of the power parameter to a reference value includes comparing a signal strength value detected by a first detector connected to an antenna port to a reference value from a second detector configured as a replica detector.

In another embodiment, providing the EHF communication chip with a parameter includes providing an EHF communication chip with a function having a controllable gain as a parameter and comparing an actual value of the parameter to a reference value of the parameter includes comparing a signal strength detected by a first detector connected to an antenna port to a reference value from a second detector configured as a replica detector. The EHF communication chip may include insulating material, a chip having an integrated circuit (IC), and an antenna that communicates with the IC and is held in a fixed location by the insulating material.

The present disclosure also provides a method that includes the step of operating a function of an EHF communication chip, where function operation is characterized by a parameter having an actual value determined by a value of a temporary parameter and a permanent parameter. The method may include comparing an actual value of the parameter with a reference value of the parameter, and determining whether the actual value of the parameter is acceptable based on the comparison of the actual value of the parameter with the reference value of the parameter. If the actual value of the parameter is determined to be unacceptable, then a value of a temporary parameter may be adjusted until the actual value is determined to be acceptable. The method may also include setting a permanent parameter to a value representative of the value of the temporary parameter for which the actual value of the parameter is acceptable.

The present disclosure also provides a calibrated reference-less EHF communication system, configured to operate at a predetermined carrier frequency, or within a range of predetermined carrier frequencies. The calibrated reference-less EHF communication system may include an EHF communication circuit, a test and trim circuit coupled to the EHF communication circuit, and a memory circuit coupled to the test and trim circuit.

The present disclosure also provides a calibrated reference-less EHF communication system, configured to operate at a predetermined carrier signal energy, or within a range of predetermined carrier signal energies. The calibrated reference-less EHF communication system may include an EHF communication circuit, a test and trim circuit coupled to the EHF communication circuit, and a memory circuit coupled to the test and trim circuit.

The present disclosure may further provide an EHF communication system that includes a reference-less oscillator that is configured to generate a carrier signal, where the generated carrier signal has a predetermined carrier frequency, or predetermined range of carrier frequencies. This EHF communication system may further include a test and trim circuit operatively coupled to the reference-less oscillator, where the test and trim circuit may be configured to calibrate the carrier frequency to within the predetermined range of carrier frequencies, and a storage element coupled to the test and trim circuit, which is in turn configured to store a value associated with the calibration.

The present disclosure may yet further provide an EHF communication system that includes a transmitter configured to transmit at a predetermined carrier signal energy level or predetermined range of carrier signal energy levels, the EHF communication system additionally including a test and trim circuit that is operatively coupled to the transmitter, where the test and trim circuit is configured to calibrate the transmitted carrier signal energy level to within the predetermined range of carrier signal energy levels, and a storage element coupled to the test and trim circuit, where the storage element may be configured to store a value associated with the calibration.

The present disclosure may yet further provide an EHF communication system that includes an EHF receiver configured to receive a transmitted EHF signal, where the EHF receiver is configured to detect a predetermined carrier signal energy level, or predetermined range of carrier signal energy levels. The EHF communication system may further include a test and trim circuit operatively coupled to the receiver, where the test and trim circuit may be configured to calibrate the detection of the carrier signal energy level to within the predetermined range of carrier signal energy levels, and a storage element coupled to the test and trim circuit, where the storage element is configured to store a value associated with the calibration.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:

1. A system comprising:
   a control circuit coupled to an extremely high frequency (EHF) communication circuit via a control interface, the control circuit configured to:
   determine a reference value of a target parameter of the EHF communication circuit;
   receive information describing an actual value of the target parameter of the EHF communication circuit via the control interface;

receive comparison information describing a comparison of the determined reference value and the information describing the actual value of the target parameter; and receive, via the control interface, information indicating a determination of whether to modify a temporary control setting associated with the target parameter.

2. The system of claim 1, wherein the control circuit is further configured to modify the temporary control setting by a specified adjustment value when the comparison information indicates that the actual value of the target parameter exceeds the target parameter tolerance level.

3. The system of claim 2, wherein the control circuit is further configured to:

compare the specified adjustment value to an adjustment threshold;

receive an adjusted actual value of the target parameter based on a modified temporary control setting; and receive updated comparison information describing a comparison of the reference value and the adjusted actual value of the target parameter.

4. The system of claim 3, wherein the control circuit is further configured to receive an indication that the modified temporary control setting is stored in a non-volatile memory component included in the EHF communication circuit when the updated comparison information satisfies a target parameter tolerance level.

5. The system of claim 1, wherein the control circuit is further configured to receive an indication that the temporary control setting is stored in a non-volatile memory component included in the EHF communication circuit when the comparison information satisfies a target parameter tolerance level.

6. The system of claim 5, wherein the non-volatile memory component further comprises a plurality of fuses, and the temporary control setting is stored in the non-volatile memory component by selectively blowing one or more of the plurality of fuses.

7. The system of claim 1, wherein the control circuit is further configured to receive an indication that the temporary control setting associated with the target parameter is stored in a temporary storage register included in the EHF communication circuit.

8. The system of claim 1, wherein the target parameter represents a carrier frequency of an oscillator included in the EHF communication circuit, the carrier frequency being a frequency within the EHF band of radio frequencies.

9. The system of claim 1, wherein the target parameter represents a transmit power of an amplifier included in the EHF communication circuit.

10. The system of claim 1, wherein the target parameter represents a gain level of an amplifier included in the EHF communication circuit.

11. The system of claim 10, wherein the target parameter represents a gain level of an amplifier included in the EHF communication circuit.

12. The system of claim 10, wherein the amplifier is a low noise amplifier.

* * * * *